United States Patent
Kato et al.

[11] Patent Number: 5,637,990
[45] Date of Patent: Jun. 10, 1997

[54] HIGH SPEED, LARGE-CURRENT POWER CONTROL APPARATUS

[75] Inventors: Katsuhisa Kato, Saitama-ken; Toshihiko Onozawa, Ibaraki-ken; Tatsuya Murofushi; Toshikazu Matsuda, both of Shizuoka-ken, all of Japan

[73] Assignee: Sony/Tektronix Corporation, Tokyo, Japan

[21] Appl. No.: 639,180

[22] Filed: Apr. 26, 1996

[30] Foreign Application Priority Data

Apr. 27, 1995 [JP] Japan .................................. 7-127023
Apr. 27, 1995 [JP] Japan .................................. 7-127024
Apr. 27, 1995 [JP] Japan .................................. 7-127025

[51] Int. Cl.$^6$ ............................. G05F 1/573; H02H 3/00
[52] U.S. Cl. ........................ 323/277; 361/101; 363/56
[58] Field of Search .............................. 323/277, 282, 323/285; 361/101; 363/56

[56] References Cited

U.S. PATENT DOCUMENTS

| | | | |
|---|---|---|---|
| 4,638,396 | 1/1987 | Mukli et al. | 361/101 |
| 4,736,267 | 4/1988 | Karlmann et al. | 323/285 |
| 5,300,765 | 4/1994 | Mizuta | 361/101 |
| 5,375,029 | 12/1994 | Fukunaga et al. | 323/285 |
| 5,440,441 | 8/1995 | Ahuja | 361/62 |
| 5,497,072 | 3/1996 | LeComte et al. | 323/277 |

*Primary Examiner*—Stuart N. Hecker
*Attorney, Agent, or Firm*—Smith-Hill and Bedell

[57] ABSTRACT

A power control apparatus for protecting an electrical circuit from excessive current and in particular for protecting it from a large and fast transition pulse caused by a rapid current polarity transition. At least two switching devices are coupled in series or in parallel between a power supply and a load. A gate signal is generated to change the switching devices from conductive state to nonconducting state in response to detection of an excessive current state. The gate signal is delayed by a predetermined period of time to change the switching devices into the nonconducting state after all of the switching devices are saturated so that the rapid current polarity transition is eliminated.

21 Claims, 5 Drawing Sheets

HIGH SPEED, LARGE-CURRENT POWER CONTROL APPARATUS

FIELD OF THE INVENTION

The present invention relates to a power control apparatus, and more particularly to a power control apparatus suitable for protecting an electronic circuit from excessive current.

BACKGROUND OF THE INVENTION

Excessive current may cause significant damage to an electronic circuit. When a semiconductor measurement apparatus tests short-circuit limit characteristics of a device under test (DUT) such as an IGBT (insulated gate bipolar transistor), it gradually increases the voltage between the collector and emitter of the transistor to test the state of short-circuit or breakdown between the collector and emitter. When the DUT is shorted, excessive current flowing through the semiconductor measurement apparatus may damage the semiconductor measurement instrument. When a motor is shorted by accident, the control circuit of the motor may be seriously damaged by excessive current. Because excessive current may damage not only a shorted circuit but also its associated circuits and control circuits, some appropriate protection circuit is required for protecting such circuits from damage due to excessive current. A typical circuit breaker using an electromagnetic relay is not suitable for rapid interception of such excessive current.

A conventional circuit breaker employing a rapid fuse or a super rapid fuse can rapidly intercept such excessive current but such a special fuse is an expensive solution to the problem because such a fuse can be used only one time. In particular, the short-circuit test of a semiconductor device is repeated many times, so that such a fuse is not cost-effective for protection of the circuit.

Another rapid breaker apparatus is disclosed in U.S. Pat. No. 5,455,502 of Kato et al. This apparatus employs an IGBT including N (integer) IGBT current paths coupled in parallel and inserted through a load current path. Each IGBT receives a control signal at its gate and the N IGBT current paths are normally turned on, so that only one N-th of the load current flows through each of the IGBT current paths and thus this apparatus can flow a large current. If each of the IGBT current paths is structured by M (integer) series-coupled IGBTs, the permissible voltage limit of the apparatus is M times as high as that of one IGBT. A current-sensing resistor is inserted through the load current path and when excessive current is detected, the IGBTs are rapidly turned off. This IGBT breaker apparatus can be used many times and is therefore very inexpensive.

The voltage-to-current characteristic of one IGBT is slightly different from that of another. FIG. 1 represents the voltage-to-current characteristics of two IGBTs which may be coupled in series. The horizontal axis represents the collector-to-emitter voltage Vce and the vertical axis represents the collector current Ic of the IGBTs. The curve 48 represents the characteristic of the lower one of the two series-coupled IGBTs and the curve 50 represents the characteristic of the upper one of them. It should be noted that the upper-lower relation of the IGBTs may be reversed. In a typical state the IGBTs are conductive and the lower IGBT has an operational point 52 and the upper IGBT has an operational point 54. When some abnormality such as a short-circuit accident occurs and the load current is increased, the current flowing the series-coupled IGBTs is also increased. If the current reaches Is56, the lower IGBT is saturated at the operational point 56 but the upper IGBT is not saturated at the operational point 58.

If one of the two series-coupled IGBTs is saturated but the other thereof is not saturated, the voltage balance between the two IGBTs is collapsed, so that the collector-to-emitter voltage of the saturated IGBT is rapidly raised and this saturated IGBT may be destroyed. This problem may similarly occur in the case where three or more IGBTs are coupled in series or transistors other than IGBTs such as power MOSFETs are used.

Furthermore, as the IGBTs which are coupled in parallel may have different characteristics, the current of one IGBT may be different from the current of another IGBT. As the load current is increased, the current balance among the parallel-coupled IGBTs may be broken, so that a particular IGBT through which the largest current flows may be damaged.

FIG. 2 represents the operation of the IGBT breaker apparatus disclosed in U.S. Pat. No. 5,455,502. The horizontal axis represents time and the vertical axis represents current flowing through the IGBT breaker, or load current. When the IGBT breaker apparatus is conductive, the load current is normally kept at a stable value Is. When the current path of the load is shorted to ground by accident at the time point t0, the load current is rapidly increased along some slope which is determinedly the time constant condition of the current path. When the current reaches the value Isat at the time point t1, the voltage across the current-sensing resistor also reaches an upper limit value, so that the IGBT breaker apparatus is turned off and the current rapidly decreases.

At the time point t1 the slope polarity of the current is abruptly changed, so that a fast spike noise or a transition pulse is generated and may cause damage to the load and its associated circuits.

What is desired is that an improved high speed, large-current power control apparatus will be provided to overcome the above-mentioned problems.

SUMMARY OF THE INVENTION

Accordingly the present invention provides a power control apparatus for protecting an electrical circuit from excessive current and in particular for protecting it from a large and fast transition pulse caused by a rapid current polarity transition such as from a positive slope to a negative slope. At least two switching devices are coupled in series or in parallel between a power supply and a load. A gate signal is generated to change the switching devices from a conductive state to a nonconducting state in response to detection of an excessive current state. The gate signal is delayed by a predetermined period of time to change the switching devices into the nonconducting state after all of the switching devices are saturated so that the rapid current polarity transition is eliminated.

The objects, advantages and other novel features of the present invention are apparent from the following detailed description when read in conjunction with the appended claims and attached drawing.

DESCRIPTION OF PREFERRED EMBODIMENTS OF THE INVENTION

Figure 3:
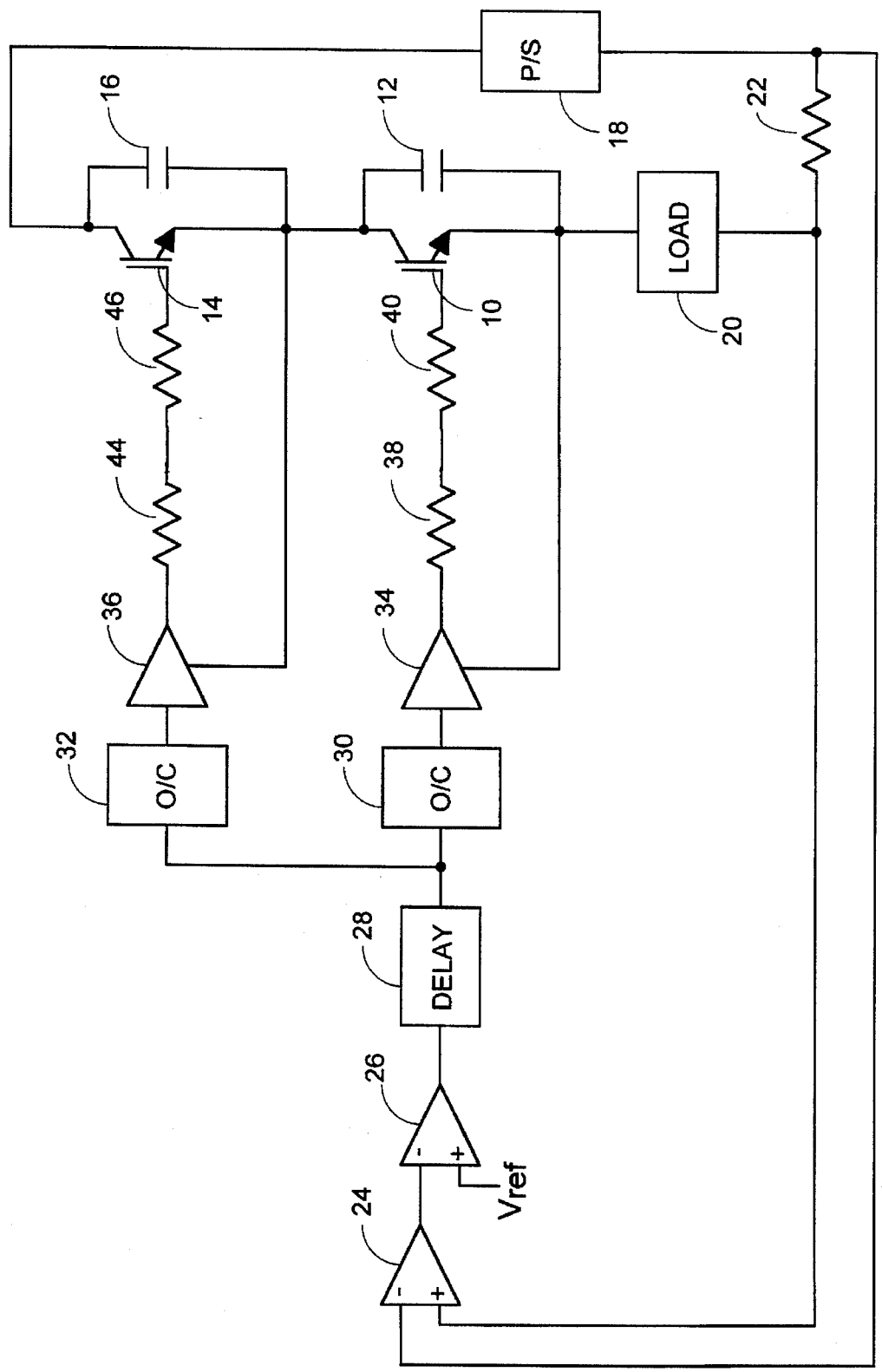
FIG. 3 is a block diagram of one preferred embodiment according to the present invention.

Referring now to FIG. 3, two IGBTs are coupled in series so that the collector of the IGBT 10 is connected to the emitter of the IGBT 14. The permissible voltage of the two series-coupled IGBTs is generally twice as high as that of a single IGBT. The collector-to-emitter path of an IGBT is a main current path. Capacitors 12 and 16 are respectively coupled between the collectors and the emitters of the IGBTs 10 and 14. The collector of the IGBT 14 is coupled to one terminal of a power supply 18 and the emitter of the IGBT 10 is coupled to one end of a load 20. The other end of the load 20 is coupled by way of a current-sensing resistor 22 to the other terminal of the power supply 18. The load 20 may be a DUT of a semiconductor measurement apparatus, a motor or the like. If the load 20 is a DUT of a semiconductor measurement apparatus, voltage measuring devices for measuring the voltage across the load 20 and for measuring the voltage across the current-sensing resistor 22 are further provided in order to measure the voltage-to-current characteristics.

A differential amplifier 24 detects the voltage across the current-sensing resistor 22, so that the detected voltage corresponds to the current flowing through the current-sensing resistor 22. A comparator 26 compares the output voltage from the amplifier 24 with a reference voltage Vref and the output state of the comparator 26 is changed when the current flowing through the load 20 reaches a predetermined limit value. Thus, the current-sensing resistor 22, differential amplifier 24 and comparator 26 form a detecting means for detecting whether the current flowing through the load 20 exceeds a predetermined limit value.

A delay circuit 28 is coupled to the output of the comparator 26 and a delayed comparison output signal is supplied to optical couplers 30 and 32. An amplifier 34 and resistors 38 and 40 are coupled in series between the output of the optical coupler 30 and the gate of the IGBT 10. The resistors 38 and 40 may have the values of 100 ohm and 1 kilo-ohm respectively. Similarly, an amplifier 36 and resistors 44 and 46 are coupled in series between the output of the optical coupler 32 and the gate of the IGBT 14. The optical couplers 30 and 32 act as a voltage isolator and the bias voltages of the amplifiers 34 and 36 are supplied from the respective emitters of the IGBTs 10 and 14, so that the gate voltages of IGBTs 10 and 14 are isolated or floated from the output voltage from the delay circuit 28.

Figure 1:
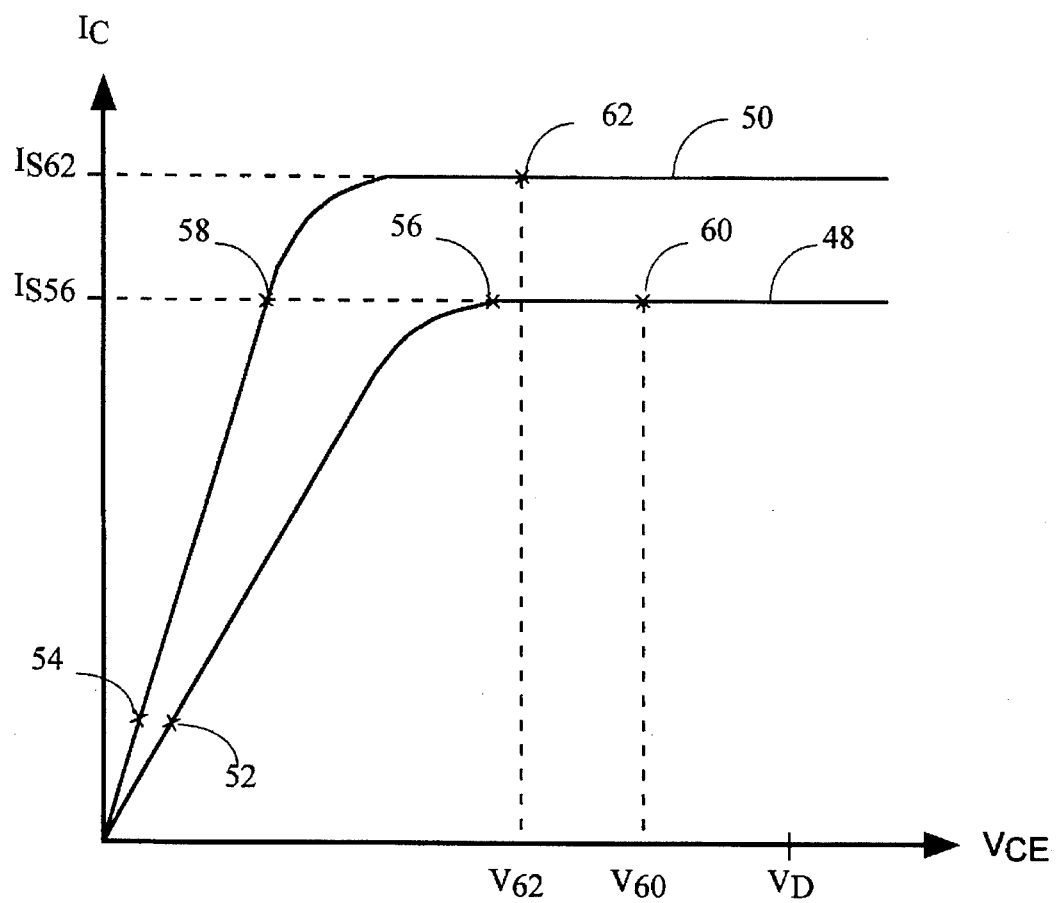
FIG. 1 is a graph representing the voltage-to-current characteristics of two series-coupled IGBTs.
Figure 2:
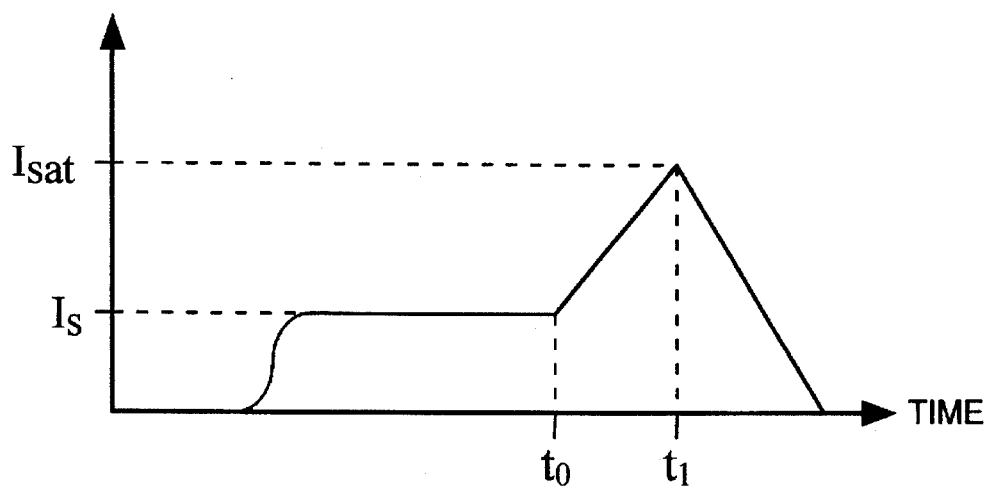
FIG. 2 is a graph representing time-to-current characteristics of a conventional breaker apparatus.

Referring again to FIG. 1, assume that the characteristic curve 48 represents the characteristic of the IGBT 10 and the curve 50 represents the characteristic of the IGBT 14. At a stationary state the load current is less than a predetermined limit value, so that the voltage across the current-sensing resistor 22 is less than the reference voltage Vref. Thus, the output from comparator 26 is kept at the high logic level. This high logic level is supplied by way of the optical couplers 30 and 32 and the amplifiers 34 and 36 to the gates of the IGBTs 10 and 14, so that the IGBTs 10 and 14 are kept in the conductive state. In this state the operational points of the IGBTs 10 and 14 are designated by the points 52 and 54 respectively.

When the load 20 is shorted to ground, the load current flowing through the current-sensing resistor 22 starts to increase along some slope determined by the inductance and resistance of the current path. This causes the output voltage of the amplifier 24 to increase so that the output level of the comparator 26 is changed to the low logic level when the output voltage from the amplifier 24 reaches the reference voltage Vref. The delay circuit 28 delays propagation of the output from the comparator 26, so that the IGBTs 10 and 14 are kept in conductive state for the delayed propagation period.

As the load current still continues to increase, the IGBT 10 is saturated at the operational point 56 but the IGBT 14 is not saturated yet at the operational point 58. The voltage-to-current relation of the IGBT 10 follows along the curve 48 in FIG. 1. Because the saturated IGBT behaves as a constant current source, the further increasing current can flow through the capacitor 12 connected across the IGBT 10, so that the total current flowing through the IGBT 10 and the capacitor 12 flows through the IGBT 14. Therefore, the IGBT 14 also becomes saturated before the IGBTs 10 and 14 are cut off by the delayed control signal from the comparator 26. The above-mentioned operation is the same as the case where the IGBT 14 is saturated earlier than the IGBT 10. Therefore, any excessive voltage is not applied to only one of the IGBTs 10 and 14. As both the IGBTs 10 and 14 are saturated, the voltage across the IGBT 10 becomes V60 at the operating point 60 and the voltage across the IGBT 14 becomes V62 at the operating point 62, so that the total voltage across the IGBTs 10 and 14 becomes substantially equal to the voltage Vd across the power supply 18 because the voltage across the load 20 and the resistor 22 is negligible. This is the final state of the change in voltage-to-current relation associated with the IGBTs 10 and 14.

After the IGBTs 10 and 14 are saturated, the delayed control signal from the comparator 26 is supplied by way of the delay circuit 28, the optical couplers 30 and 32, amplifiers 34 and 36 and resistors 38, 40, 44, and 46 to the gates of the IGBTs 10 and 14, so that both IGBTs 10 and 14 become cut off or nonconducting. Therefore, the polarity of the load current flowing through the load 20 is not rapidly changed from positive to negative. The load current changes from the increasing state to the saturated or constant state and then from the saturated state to the decreasing state. This reduction of current changing rate can prevent generation of a spike noise or a rapid transition pulse. It is possible to use three or more series-coupled IGBTs suitably for a desired maximum voltage.

Figure 4:
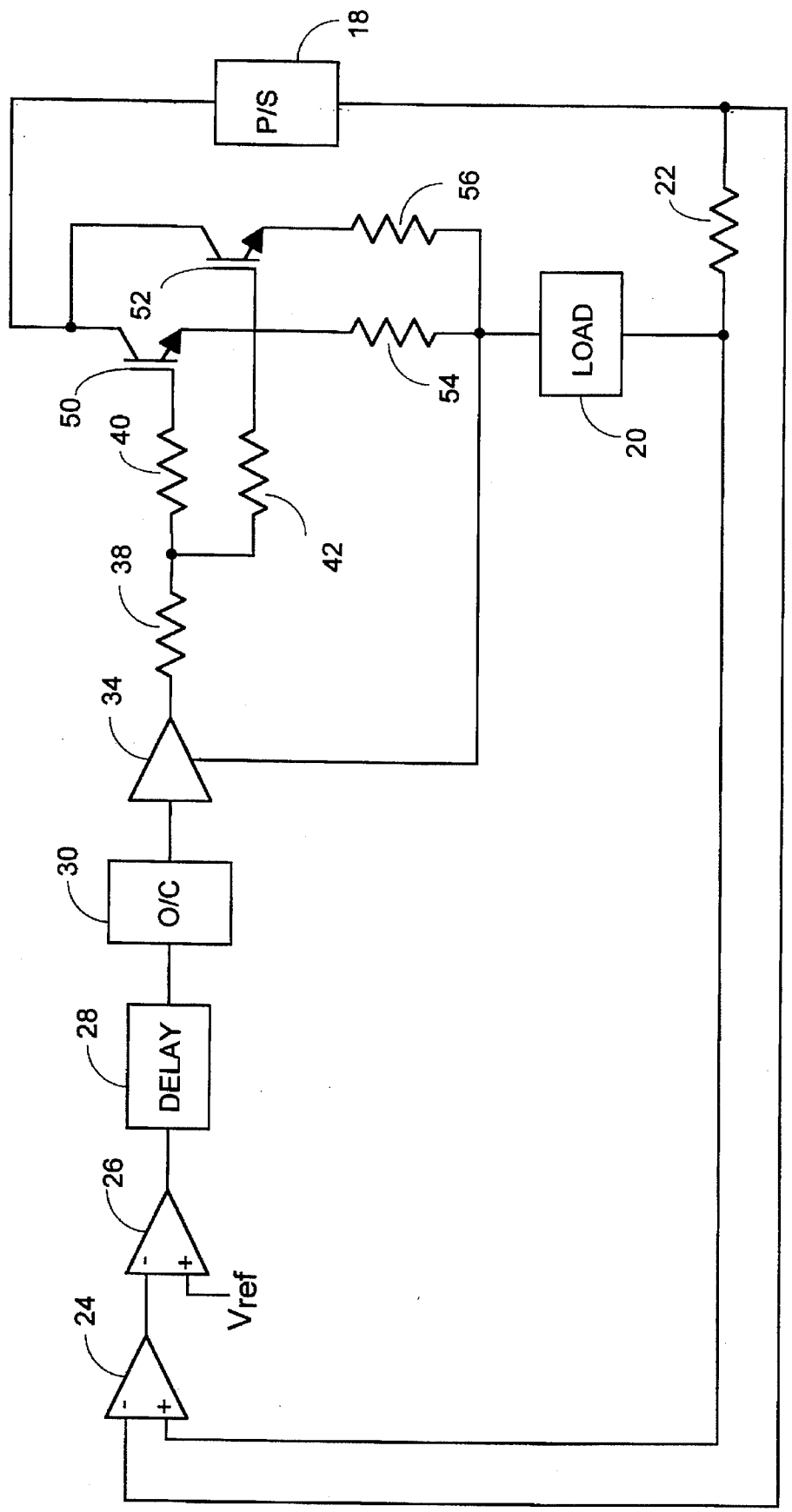
FIG. 4 is a block diagram of another preferred embodiment according to the present invention.

Referring now to FIG. 4, two IGBTs 50 and 52 are coupled in parallel. The collectors thereof are connected to each other and the emitters thereof are coupled by way of resistors 54 and 56 to each other. The maximum current of this circuit is substantially twice as large as that of a single IGBT circuit. A power supply 18, a load 20 and a current-sensing resistor 22 are coupled in series between the collectors of the IGBT 50 and 52 and the node of the resistors 54 and 56.

A differential amplifier 24 detects the voltage across the current-sensing resistor 22, so that the detected voltage corresponds to the current flowing through the current-sensing resistor 22. A comparator 26 compares the output voltage from the amplifier 24 with a reference voltage Vref and the output state of the comparator 26 is changed when the current flowing through the load 20 reaches a predetermined limit value. Thus, the current-sensing resistor 22, differential amplifier 24 and comparator 26 form a detecting means for detecting whether the current flowing through the load 20 exceeds a predetermined limit value. A delay circuit 28 is coupled to the output of the comparator 26 and a delayed comparison output signal is supplied to optical coupler 30. An amplifier 34 and resistors 38 and 40 are coupled in series between the output of the optical coupler 30 and the gate of the IGBT 50. The resistors 38 and 40 may have the values of 100 ohm and 1 kilo-ohm respectively. The node of the resistors 38 and 40 is coupled by way of a resistor 42 to the gate of the IGBT 52. The resistor 42 may have the value of 1 kilo-ohm. The IGBTs 50 and 52 are controlled by the output from the amplifier 34. The optical coupler 30 acts as a voltage isolator and the bias voltage of the amplifiers 34 is supplied from the emitters of the IGBTs 50 and 52, so that the gate voltages of IGBTs 50 and 52 are isolated or floated from the output voltage from the delay circuit 28.

In operation, as the load current is less than a predetermined limit value at in stationary state, the voltage across the current-sensing resistor 22 is less than the reference voltage Vref. Thus, the output from comparator 26 is kept at the high logic level. This high logic level is supplied by way of the optical coupler 30 and the amplifier 34 to the gates of the IGBTs 50 and 52, so that the IGBTs 50 and 52 are kept in the conductive state.

When the load 20 is shorted to ground, the load current flowing through the current-sensing resistor 22 starts to increase along some slope determined by the inductance and resistance of the current path. This causes the output voltage of the amplifier 24 to increase so that the output level of the comparator 26 is changed to the low logic level when the output voltage from the amplifier 24 reaches the reference voltage Vref. The delay circuit 28 delays propagation of the output from the comparator 26, so that the IGBTs 50 and 52 are kept in conductive state for the delayed propagation period.

As a sufficiently large voltage is applied to the IGBTs 50 and 52, both the IGBTs 50 and 52 become saturated, so that the load current reaches a constant value or the total current flowing through the IGBTs 50 and 52.

After the IGBTs 50 and 52 are saturated, the delayed control signal from the comparator 26 is supplied to the gates of the IGBTs 50 and 52, so that both the IGBTs 10 and 14 become cut off or nonconducting. Therefore, the polarity of the load current flowing through the load 20 is not rapidly changed from positive to negative. The load current changes from the increasing state to the saturated or constant state and then from the saturated state to the decreasing state. This reduction of current change can prevent generation of a spike noise or a rapid transition pulse.

Generally, the IGBTs 50 and 52 do not become nonconducting at the same time because their characteristics are slightly different. If one of IGBTs 50 and 52 becomes nonconducting and the other of them is still conductive, the collector voltage of the nonconducting IGBT is rapidly increased and then may significantly affect the gate of the conductive IGBT by way of a collector-to-gate feedback capacitance. The gate resistors 40 and 42 can reduce this undesired interaction caused by the turn-off-timing-variations of the IGBTs. Without the gate resistors 40 and 42, the undesired interaction may further delay turn-off of the conductive IGBT, so that the conductive IGBT may be damaged by the switching loss of the IGBTs 50 and 52.

The emitter resistors 54 and 56 function to reduce or stabilize current-variations of the IGBTs 50 and 52 in the stationary state. The sum of the voltage drops of the IGBT 50 and the resistor 54 is equal to the sum of the voltage drops of the IGBT 52 and the resistor 56. Thus, when the increase of the current flowing through the IGBT 50 increases the voltage drop of the resistor 54, so that the collector-to-emitter voltage of the IGBT 50 is decreased and then the increase of the current is suppressed. This is similar to the case of the current variations of the IGBT 52 and emitter resistor 56. Therefore, the currents flowing through the IGBTs 50 and 52 are balanced or stabilized by the emitter resistors 54 and 56 respectively since the IGBTs 50 and 52 are commonly controlled by the amplifier 34, so that the heat made by the IGBTs 50 and 52 is also balanced.

As explained above, the current through the IGBTs 50 and 52 is automatically balanced or stabilized such that current concentration on only one of the IGBTs is automatically prevented. Although two parallel-coupled IGBTs are used in FIG. 4, more than two IGBTs can be used suitably for a desired maximum current.

Figure 5:
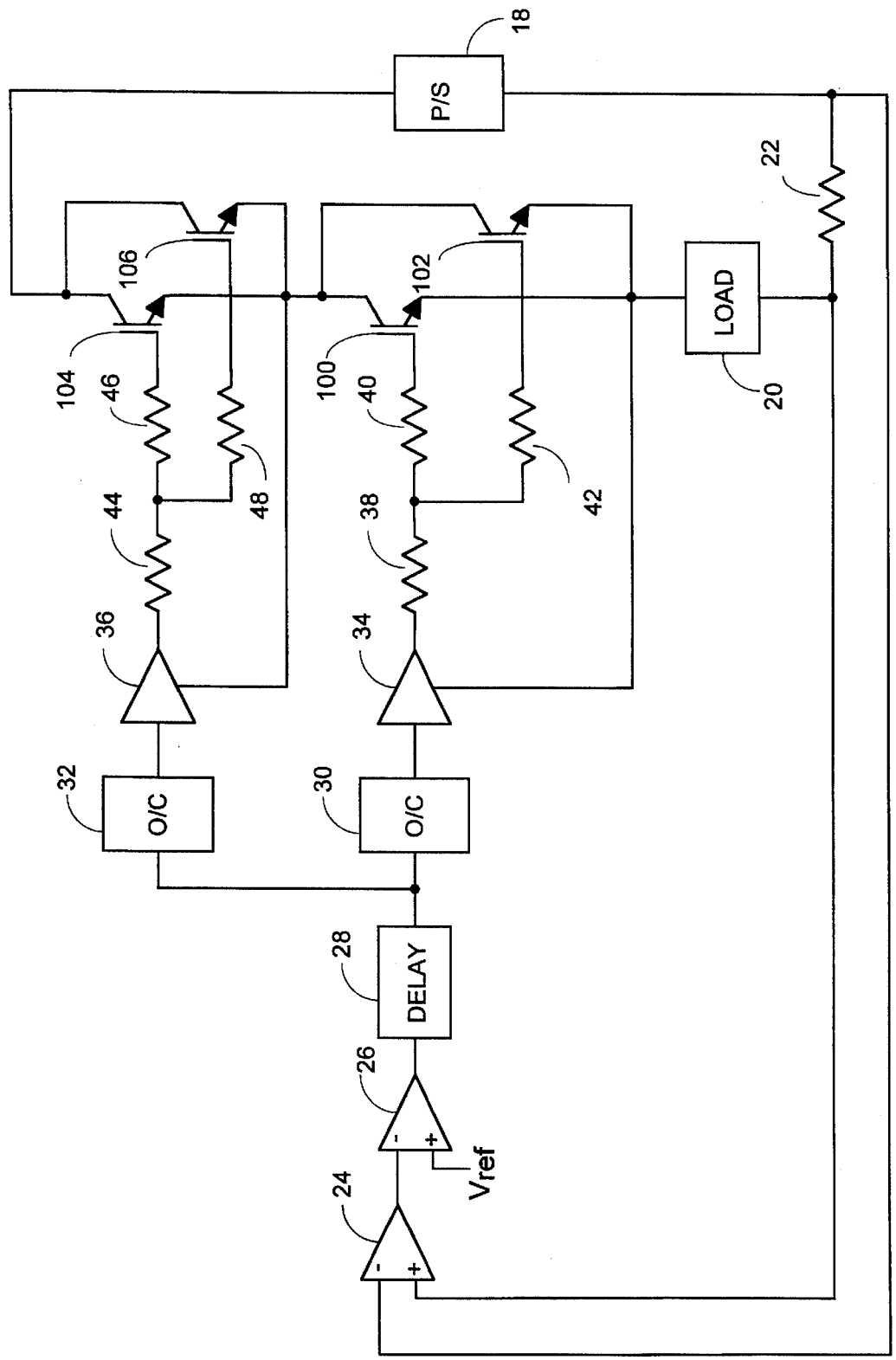
FIG. 5 is a block diagram of yet another embodiment according to the present invention.

Referring now to FIG. 5, four IGBTs 100, 102, 104 and 106 form an array of two rows and two columns. Of course, it is generally possible to provide an IGBT array circuit of M (integer of two or more) rows and N (integer of two or more) columns. The collector and emitter of the IGBT 100 are respectively coupled to the collector and emitter of the IGBT 102. Similarly, the collector and emitter of the IGBT 104 are respectively coupled to the collector and emitter of the IGBT 106. The two sets of parallel circuits are coupled in series to form the IGBT array circuit. This IGBT array circuit has the maximum current and voltage limits which are twice as large as those of a single IGBT. The collectors of the IGBTs 104 and 106 are coupled to one end of a power supply 18 and the emitters of the IGBT 100 and 102 are coupled to one end of a load 20. The other end of the load 20 is coupled by way of a current-sensing resistor 22 to the other end of the power supply 18.

A differential amplifier 24 detects the voltage across the current-sensing resistor 22, so that the detected voltage corresponds to the current flowing through the current-sensing resistor 22. A comparator 26 compares the output voltage from the amplifier 24 with a reference voltage Vref and the output state of the comparator 26 is changed when the current flowing through the load 20 reaches a predetermined limit value. Thus, the current-sensing resistor 22, differential amplifier 24 and comparator 26 form a detecting means for detecting whether the current flowing through the load 20 exceeds a predetermined limit value.

A delay circuit 28 is coupled to the output of the comparator 26 and a delayed comparison output signal is supplied to optical couplers 30 and 32. An amplifier 34 and resistors 38 and 40 are coupled in series between the output of the optical coupler 30 and the gate of the IGBT 100. The node of the resistors 38 and 40 is coupled by way of a resistor 42 to the gate of the IGBT 102. Similarly, an amplifier 36 and resistors 44 and 46 are coupled in series between the output of the optical coupler 32 and the gate of the IGBT 104. The node of the resistors 44 and 46 is coupled by way of a resistor 48 to the gate of the IGBT 106. The optical couplers 30 and 32 act as a voltage isolator and the bias voltages of the amplifiers 34 and 36 are supplied from the respective emitters of the IGBTs 100 and 104, so that the gate voltages of IGBTs 100, 102, 104 and 106 are isolated or floated from the output voltage from the delay circuit 28.

Figure 6:
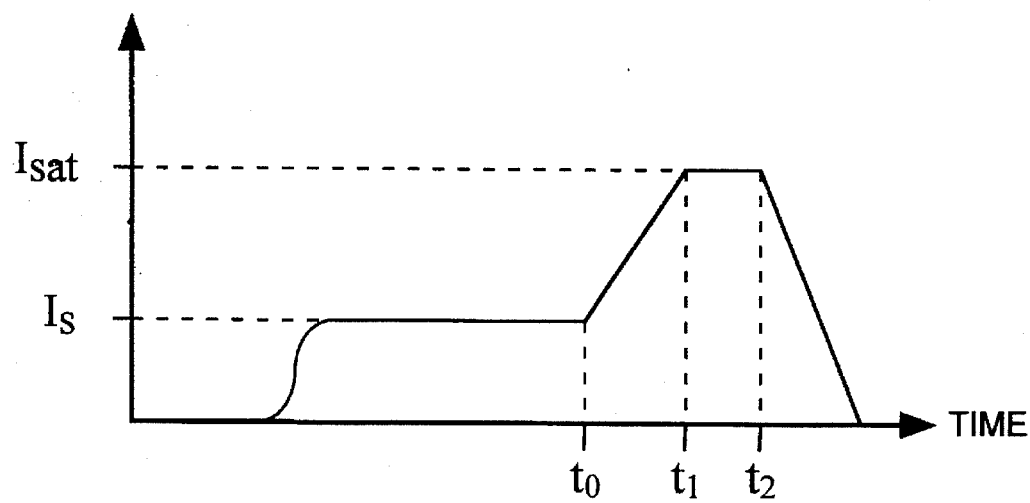
FIG. 6 is a graph representing time-to-current characteristics of a power control apparatus according to the present invention.
Figure 7:
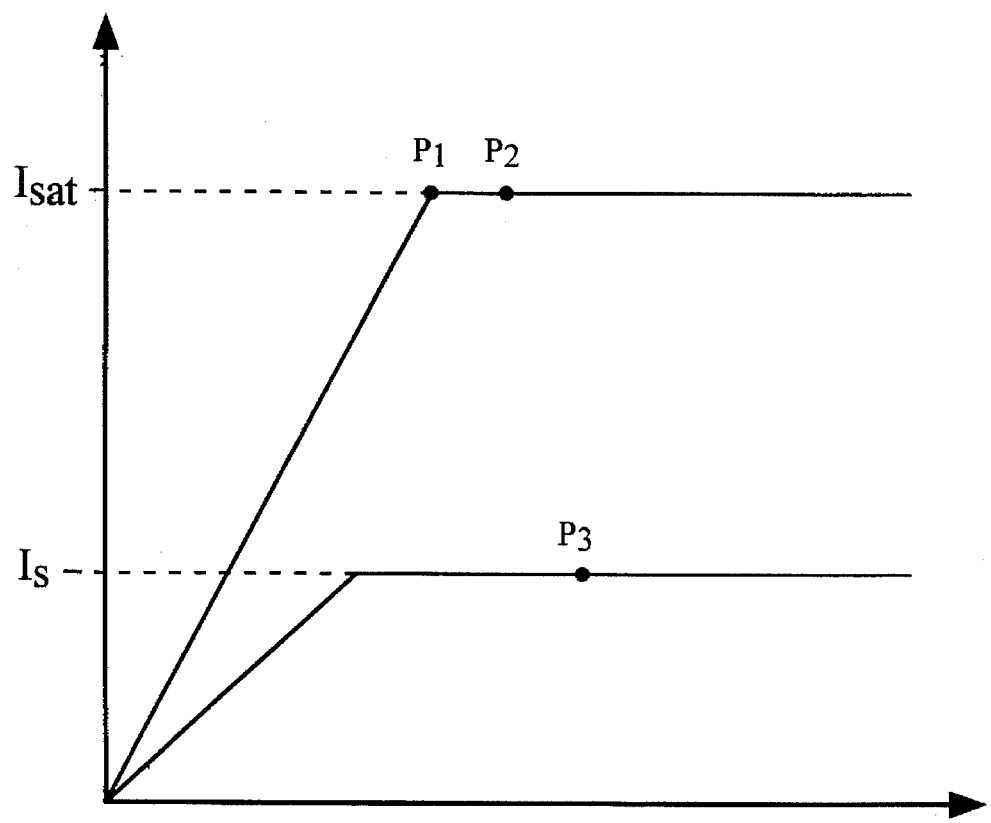
FIG. 7 is a graph representing voltage-to-current characteristics of semiconductor devices according to the present invention.

Referring now to FIGS. 6 and 7, the operation of the circuit in FIG. 5 is described. Since the load current is less than a predetermined limit value at a stationary state, the voltage across the current-sensing resistor 22 is less than the reference voltage Vref. The output from comparator 26 is kept at the high logic level. This high logic level signal is supplied by way of the optical couplers 30 and 32, the amplifiers 34 and 36 to the gates of the IGBTs 100, 102, 104 and 106, so that the IGBTs 100, 102, 104 and 106 are kept in the conductive state.

When the load 20 is shorted to ground by accident, the load current flowing through the current-sensing resistor 22 starts to increase along some slope determined by the time constant of the current path at the time point t0 (FIG. 6). This causes the output voltage of the amplifier 24 to increase so that the output level of the comparator 26 is changed to the low logic level when the output voltage from the amplifier 24 reaches the reference voltage Vref or the load current reaches a predetermined saturation current Isat at the time point t1. The delay circuit 28 delays propagation of the output from the comparator 26, so that the IGBTs 100, 102, 104 and 106 are kept in the conductive state for the delayed propagation period.

As the IGBTs 100, 102, 104 and 106 are saturated at the operational point P1 (FIG. 7), the load current is kept to be the saturation current Isat. As the voltage across the IGBTs 100, 102, 104 and 106 increase, the operational point changes from P1 to P2.

The delayed control signal from the comparator 26 is supplied by way of the delay circuit 28, the optical couplers 30 and 32, amplifiers 34 and 36 and resistors 38, 40, 44, 46 and 48 to the gates of the IGBTs 100, 102, 104 and 106, so that these IGBTs become cut off or nonconducting at the time point t2. Therefore, the polarity of the load current flowing through the load 20 is not rapidly changed from positive to negative. The load current changes from the increasing state to the saturated or constant state and then from the saturated state to the decreasing state. This reduction of current changing rate can prevent generation of a spike noise or a rapid transition pulse.

It will be appreciated that the invention is not restricted to the particular embodiments that have been described, and that variations may be made therein without departing from the scope of the invention as defined in the appended claims and equivalents thereof. For example, semiconductor devices of the power control apparatus of the invention are not restricted to IGBTs and power MOSFETs can also be used therefor. It is also possible to detect excessive current by using means for detecting the change of magnetic field associated with a load without a current-sensing resistor.

We claim:

1. A power control apparatus for controlling supply of electrical power to a load, comprising:

a switching means for switching a current path between a power supply and the load, the switching means including at least two switching devices connected in series and each switching device having an unsaturated state, in which voltage developed across the switching device increases substantially with increase in current conducted by the switching device, and a saturated state, in which voltage developed across the switching device does not increase substantially with increase in current conducted by the switching device, and the switching means being responsive to a gate signal to change from a conductive state to a non-conducting state, a generating means for generating said gate signal when current through the load exceeds a predetermined value, and a delay means for delaying the gate signal from the generating means by a predetermined period of time to change the switching means to the non-conducting state after all of the switching devices of the switching means are in the saturated state.

2. A power control apparatus according to claim 1, wherein the switching means further comprises capacitors coupled in parallel across the switching devices respectively.

3. A power control apparatus according to claim 1, wherein the generating means comprises means for detecting whether a current flowing through the load exceeds a predetermined value to generate the gate signal.

4. A power control apparatus according to claim 1, wherein the delaying means comprises voltage isolation means for providing voltage isolation between the generating means and the switching means.

5. A power control apparatus according to claim 4, wherein each switching device has a control terminal and the voltage isolation means comprises at least two optical couplers coupled to the control terminals of the switching devices respectively.

6. A power control apparatus according to claim 1, wherein each switching device is a transistor having a control terminal and an emitter and the apparatus further comprises at least two amplifiers having outputs coupled to the control terminals of the switching devices respectively, and the emitters of the transistors supply bias voltages to the amplifiers respectively.

7. A power control apparatus for controlling supply of electrical power to a load, comprising:

a switching means for switching a current path between a power supply and the load, the switching means including at least two switching devices connected in parallel and each switching device having an unsaturated state, in which voltage developed across the switching device increases substantially with increase in current conducted by the switching device, and a saturated state, in which voltage developed across the switching device does not increase substantially with increase in current conducted by the switching device, and the switching means being responsive to a gate signal to change from a conductive state to a non-conducting state, a generating means for generating said gate signal when current through the load exceeds a predetermined value, and a delay means for delaying the gate signal from the generating means by a predetermined period of time to change the switching means to the non-conducting state after all of the switching devices of the switching means are in the saturated state.

8. A power control apparatus according to claim 7, wherein the generating means comprises means for detecting whether a current flowing through the load exceeds a predetermined value to generate the gate signal.

9. A power control apparatus according to claim 7, wherein the delaying means comprises voltage isolation means for providing voltage isolation between the generating means and the switching means.

10. A power control apparatus according to claim 9, wherein each switching device has a control terminal and the voltage isolation means comprises an optical coupling means coupled to the control terminals of the switching devices respectively.

11. A power control apparatus according to claim 7, wherein each switching device is a transistor having a control terminal and an emitter and the apparatus further comprises an amplifier having an output coupled to the control terminals of the transistors respectively, and the emitters of the transistors supply bias voltage to the amplifier.

12. A power control apparatus according to claim 11, comprising at least two gate resistors coupled between the output of the amplifier and the control terminals of the transistors respectively.

13. A power control apparatus according to claim 7, wherein each switching device is a transistor having a control terminal and an emitter, the delaying means comprises an optical coupler for providing voltage isolation between the generating means and the control terminals of the transistors, the apparatus further comprises an amplifier having an input coupled to the optical coupler and an output coupled to the control terminals of the transistors respectively, and the emitters of the transistors supply bias voltage to the amplifier.

14. A power control apparatus for controlling supply of electrical power to a load, comprising:

a switching means for switching a current path between a power supply and the load, the switching means including an array of switching devices in a first plurality of rows and a second plurality of columns, wherein each column is formed by a plurality of switching devices, one from each row, coupled in series so that the columns provide a plurality of parallel current paths between the power supply and the load, and wherein each switching device has an unsaturated state, in which voltage developed across the switching device increases substantially with increase in current conducted by the switching device, and a saturated state, in which voltage developed across the switching device does not increase substantially with increase in current conducted by the switching device, and the switching means being responsive to a gate signal to change from a conductive state to a non-conducting state, a generating means for generating said gate signal when current through the load exceeds a predetermined value, and a delay means for delaying the gate signal from the generating means by a predetermined period of time to change the switching means to the non-conducting state after all of the switching devices of the switching means are in the saturated state.

15. A power control apparatus according to claim 14, wherein the generating means comprises means for detecting whether a current flowing through the load exceeds a predetermined value to generate the gate signal.

16. A power control apparatus according to claim 14, wherein the delaying means comprises voltage isolation means for providing voltage isolation between the generating means and the switching means.

17. A power control apparatus according to claim 16, wherein each switching device has a control terminal and the voltage isolation means comprises an optical coupling means coupled to the control terminals of the switching devices.

18. A power control apparatus according to claim 14, wherein each switching device is a transistor having a control terminal and an emitter and the apparatus further comprises at least one amplifier having an output coupled to the respective control terminals of the transistors in one of the rows, and the emitters of the transistors in said one row supply bias voltage to said one amplifier.

19. A power control apparatus according to claim 18, comprising a plurality of gate resistors coupled between the output of said one amplifier and the respective control terminals of the transistors in said one row.

20. A power control apparatus according to claim 14, wherein each switching device is a transistor having a control terminal and an emitter, the delaying means comprises at least one optical coupler for providing voltage isolation between the generating means and the control terminals of the transistors in one of said rows, the apparatus further comprises at least one amplifier having an input coupled to said one optical coupler and an output coupled to the control terminals of the transistors in said one row, and the emitters of the transistors in said one row supply bias voltage to said one amplifier.

21. A power control apparatus according to claim 14, wherein the switching devices in each row are connected in parallel.

* * * * *